United States Patent
Bedell

(10) Patent No.: US 9,793,429 B2
(45) Date of Patent: Oct. 17, 2017

(54) PHOTOVOLTAIC INTENSIFICATION SYSTEM USING SOLAR TRACKING CONCENTRATORS AND HEAT EXCHANGERS

(71) Applicant: Alfred Hyamo Bedell, Lansdowne, PA (US)

(72) Inventor: Alfred Hyamo Bedell, Lansdowne, PA (US)

( * ) Notice: Subject to any disclaimer, the term of this patent is extended or adjusted under 35 U.S.C. 154(b) by 232 days.

(21) Appl. No.: 14/527,392

(22) Filed: Oct. 29, 2014

(65) Prior Publication Data

US 2015/0155414 A1 Jun. 4, 2015

Related U.S. Application Data

(60) Provisional application No. 61/981,840, filed on Apr. 20, 2014, provisional application No. 61/910,408, filed on Dec. 1, 2013.

(51) Int. Cl.
*H01L 31/054* (2014.01)
*H01M 10/46* (2006.01)
(Continued)

(52) U.S. Cl.
CPC ............ *H01L 31/0543* (2014.12); *F24J 2/02* (2013.01); *F24J 2/08* (2013.01); *F24J 2/14* (2013.01);
(Continued)

(58) Field of Classification Search
CPC ...... F24J 2/02; F24J 2/54; F24J 2/5417; F24J 2/5431; F24J 2/542; F24J 2/5424; F24J 2002/5441; Y02B 40/18
See application file for complete search history.

(56) References Cited

U.S. PATENT DOCUMENTS 5,617,843 A * 4/1997 Erwin .................. F24J 2/02
126/608
8,350,204 B2 1/2013 Moser
(Continued)

FOREIGN PATENT DOCUMENTS

CN 201069197 Y * 6/2008

OTHER PUBLICATIONS

English Translation of CN 201069197 Y provided by EPO.*

*Primary Examiner* — Jeffrey T Barton
*Assistant Examiner* — Daniel Malley, Jr.
(74) *Attorney, Agent, or Firm* — IDP Patent Services; Olav M. Underdal

(57) ABSTRACT

A photovoltaic intensification system includes a solar array stand, further including a mounting base; a mounting column; a solar array frame, a solar array, solar array lenses or reflectors, a light sensor, an elevation actuator, and a horizontal actuator; and a solar system cart, further including: a cart enclosure, a radiant solar cooker chamber, cart reflectors, and cart wheels. Further included are a vertical tilt ring, a strong-arm rod, a mass pivot rod, an elevation actuating ring, a horizontal tilt ring, and mounting brackets. A power and control system for photovoltaic intensification further includes a battery charger, a battery, an A/C inverter, a solar control unit, a remote control, a thermo electric freezer component, and a heat exchanger. A solar control unit includes a light sensor control circuit and a temperature control circuit, or a processor, a non-transitory memory, an input/output, an actuator controller, and a temperature controller.

14 Claims, 16 Drawing Sheets

(51) Int. Cl.

| | | |
|---|---|---|
| *H02S 20/32* | (2014.01) | |
| *H02S 40/22* | (2014.01) | |
| *F24J 2/02* | (2006.01) | |
| *H02J 7/35* | (2006.01) | |
| *F24J 2/08* | (2006.01) | |
| *F24J 2/14* | (2006.01) | |
| *F24J 2/16* | (2006.01) | |
| *F24J 2/54* | (2006.01) | |
| *F24J 2/38* | (2014.01) | |

(52) U.S. Cl.
 CPC ............... *F24J 2/16* (2013.01); *F24J 2/541* (2013.01); *F24J 2/542* (2013.01); *F24J 2/5424* (2013.01); *H01M 10/465* (2013.01); *H02J 7/355* (2013.01); *H02S 20/32* (2014.12); *H02S 40/22* (2014.12); *F24J 2/38* (2013.01); *Y02B 40/18* (2013.01); *Y02E 10/45* (2013.01); *Y02E 10/47* (2013.01); *Y02E 10/52* (2013.01)

(56) References Cited

U.S. PATENT DOCUMENTS

| | | |
|---|---|---|
| 8,353,167 B2 | 1/2013 | McGann |
| 8,418,686 B1 | 4/2013 | Liao |
| 8,459,249 B2 | 6/2013 | Corio |
| 8,481,906 B2 | 7/2013 | Sobolewski |
| 8,519,257 B2 | 8/2013 | Conger |
| 8,522,773 B2 | 9/2013 | Meyer |
| 8,592,673 B2 | 11/2013 | Benitez |
| 8,609,977 B2 | 12/2013 | Jones |
| 8,671,930 B2 | 3/2014 | Liao |
| 9,324,893 B1* | 4/2016 | Kats ............... H02J 7/0052 |
| 2008/0314436 A1* | 12/2008 | O'Connell ........ H01L 31/02167 136/246 |
| 2010/0242948 A1 | 9/2010 | Fleischmann |
| 2011/0011802 A1* | 1/2011 | Maydan ............. C02F 1/02 210/652 |
| 2011/0043433 A1* | 2/2011 | Klien ............... G02B 7/183 343/882 |
| 2011/0186109 A1 | 8/2011 | Elazari |
| 2011/0232722 A1 | 9/2011 | Eriksson |
| 2012/0048340 A1* | 3/2012 | Qadir ............... F24J 2/38 136/246 |
| 2012/0300962 A1* | 11/2012 | Devoto ............. H04R 5/02 381/300 |
| 2013/0022727 A1* | 1/2013 | Sherwin ............ F24J 2/02 426/523 |
| 2014/0007919 A1 | 1/2014 | Brottier |
| 2014/0041710 A1 | 2/2014 | Hwang |
| 2015/0208848 A1* | 7/2015 | Huang ............. A47J 27/21166 99/403 |

* cited by examiner

Photovoltaic Intensification System

Power and Control System for Photovoltaic Intensification

PHOTOVOLTAIC INTENSIFICATION SYSTEM USING SOLAR TRACKING CONCENTRATORS AND HEAT EXCHANGERS

CROSS-REFERENCE TO RELATED APPLICATIONS

This application claims the benefit of U.S. Provisional Application No. 61/910,408, filed Dec. 1, 2013, and U.S. Provisional Application No. 61/981,840, filed Apr. 20, 2014, both of which provisional applications are included herein by reference in their entirety.

FIELD OF THE INVENTION

The present invention relates generally to the technical field of energy production, and more particularly to the technical field of intensification of photovoltaic cells power generation by periodic alignment with radiant energy sources. The present invention also relates to solar tracking optimization systems for photovoltaic cells in a two axial movement system.

BACKGROUND OF THE INVENTION

It is projected that the world's population will increase by over two billion in the year 2050, with Sub-Saharan Africa having the highest population growth rate to over 2.4 billion in the next 40 years. In order to meet the need of a growing population, 60% more food must be produced. Food security is defined as the opportunity for all individuals to have availability, access, utilization, and stability to nutritious and wholesome foods produced in a sustainable environment. Poverty limits the development of food security for a number of reasons, including lack of market information, poor skill development, low security of income, inadequate credit for investment, a lack of electricity, and limited water supply.

Almost 1.5 billion farmers worldwide lack access to clean water and sanitation, and live on less than $2 a day. On average, countries in Sub-Saharan Africa spend 5% of GDP, or $28.4 billion annually, on health spending and labor diversion due to poor sanitation and lack of clean water access. Worldwide, there are over 500 million smallholding farmers, who feed over 2 billion individuals.

Barriers to establishing a solar system and renewable water technology in developing countries include costly engineering assessments, high installation labor cost, the financial burden of buying equipment, lack of appropriate distribution channels, and insufficient business models.

The simplest way to increase the efficiency of solar panels, thermal cells, and the like is by utilizing heliostatic motions, thereby tracking the sun across the sky throughout the day. Solar trackers tend to have a mounted column that supports the weight of the solar panel, and is securely fasten to the sub-level or ground.

To incorporate the three-dimensional movements of a two-axis tracker, a slew drive would typically be placed between a solar assembly and the column. Due to the technical constraints of the elemental effects of weather and wind, a slew drive must be designed in correlation with the size of an array in order to sustain the full weight capacity of the assembled system. This fact adds significant cost to the entire system.

This may present a barrier for implementation of technology in developing countries. In this regard, the photovoltaic intensification system has no incorporated slew drive for the rotation of the assembled array, and by alternating the art of the solar tracker, engineers will be able to design a tracking system that is both light weight and more efficient than other solar trackers.

As such, considering the foregoing, it may be appreciated that there continues to be a need for novel and improved devices and methods for photovoltaic intensification systems.

SUMMARY OF THE INVENTION

The foregoing needs are met, to a great extent, by the present invention, wherein in aspects of this invention, enhancements are provided to the existing models of solar power generating systems.

In an aspect, a photovoltaic intensification system is a power generating system that allows a user to magnify the efficiency of photovoltaic cells.

The photovoltaic intensification system addresses the challenges of a market of almost 2 billion farmers and promotes food security by introducing a creative purchase agreement, and providing solar water irrigation systems for crops and livestock.

Innovative technology in the photovoltaic intensification system removes these barriers by offering a pre-engineered solar system that significantly reduces the amount of solar cells needed, thereby lowering setup costs by more than 50%. Additionally, reflectors and solar cell cooling chambers are used to encapsulate added radiant energy. The photovoltaic intensification system is self-monitoring, and adjusts automatically using a microprocessor. In a prototype installation, the photovoltaic intensification system increased the solar energy measured (W/m2) and total solar energy collected ($W/m^2$) by over 60% in a 12-hour charge period. The photovoltaic intensification system can be used in collaboration with drip irrigation, which is 95% more efficient than hand pumping. The photovoltaic intensification system provides farmers with cost-effective solar energy, and promotes a secure food network by increasing agricultural production using a renewable water supply. It will also reduce price shock due to food shortages.

In a related aspect, the photovoltaic intensification system can provide subsistence farmers in developing countries with an irrigation watering system, a freezer for food conservation, a solar cooker, and free electricity for appliances like phones and computers. The solar cooker can allow a family or community convenient access to a cooking facility, without relying on the use of expensive and polluting combustible fuel, such as petroleum.

In a further related aspect, the photovoltaic intensification system can help minimize the financial barriers for over 1.5 billion subsistence farmers in developing countries to obtain efficient solar energy with minimal capital investments. The photovoltaic intensification system can increase agricultural production and reduce drought over rain-fed agriculture three to four fold (300%) using a renewable water irrigation system. Overall, the photovoltaic intensification system can improve the economic security of farmers, and will aide in the eradication of poverty and hunger.

Human power for manual water lifting devices such as the bush pump, Keith Hendrick's hand pump, rope and washer pump, and the rower pump will yield a muscular work capacity of about 200-300 Wh/person per workday. A person would need to work four days to provide one kWh of work, whereas the photovoltaic intensification system would deliver this in four hours. Thus, the photovoltaic intensification system provides the equivalent of 12 workers minus the labor salaries. Even though human powered watering devices have a low capital cost ($10 to $150), the assumed $4.00/kWh energy-wage cost of Human labor is significantly higher than the free source of solar energy for the photovoltaic intensification system, making the photovoltaic intensification system a more cost-effective system for subsistence farming.

Additionally, the limitation of Human power is that people must be paid and fed 365 days of the year, but the typical irrigation season of crops last 200 days out of the year. Using the photovoltaic intensification system will lower the demand of Human power, which will allow farmers more time for educational development.

Diesel powered watering systems have a capital cost of ($500-$1,500), and the cost of fuel fluctuates ($1.20 to $1.70 per liter) depending on the availability and usage. Diesel pumps have a higher operating cost ($12,525/year at $6.27/kWh) than solar pumps ($335/year at $0.66/kWh). Diesel pumps also emit harmful gases into the atmosphere. The solar market is a $39.6 billion industry with projections of exponential growth to $155 billion in 2018.

Wattsun Solar, a division of Array Technologies Inc., is a leading supplier of solar trackers and racks. They have effective single axis systems (Wattsun AZ-125) that track the sun, but the initial setup cost ($3,385) without the inclusion of solar hardware (panel, controller, battery bank) is high.

Zomeworks commercializes a passive tracking unit (UTRF-090) that is affordable ($1872), and rely on the density of Freon and not electronic sensors. However, they are slow moving, have poor efficiency in the morning hours, and do not come with solar hardware (panel, controller, battery bank).

The photovoltaic intensification system performs better due to the use of dual axis control, self-monitoring, and fluid filled cooling chambers.

In an aspect, the photovoltaic intensification system utilizes fluid such as water via heat exchangers to periodically cool photovoltaic cells to a lower temperature, and also conducts heliostatics using motors and microcontrollers to position solar panels in an optimal point of reference in relation to the source of radiant energies, such as the sun.

In a related aspect, the photovoltaic intensification system incorporates reflectors positioned at an optimal angle to encapsulate additional radiant energies. The current invention utilizes the surplus generated power (watts) to maintain the functioning of the microprocessor that guides the operation of the motoring systems, such as actuators in the azimuth angle and the angle of inclination.

In a further related aspect, the photovoltaic intensification system also rotates the loads such as photovoltaic cell, thermal cells and the like around the x-y horizontal planes, and the z-axis, thus creating a two axial three-dimensional movement.

In another aspect, the photovoltaic intensification system has an embedded radiant energy cooker and refrigerator. The current invention will allow users the ability to maximize their solar energy accumulation with minimal financial investments for additional photovoltaic cells.

In an aspect, the benefit of such technology as related to the current disclosed invention is the ability for developing countries, especially in the field of agriculture to have cost-effective solutions for energy demands. The intensified energies received from the current invention will allow small-scale farmers access to irrigation pumps, will provide an unlimited supply of free sustainable energy, and will create financial relief to the uncertain fluctuation of hydrocarbon fuels. Ultimately, this will assist in the reduction of carbon emissions and greenhouse gases.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. In addition, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
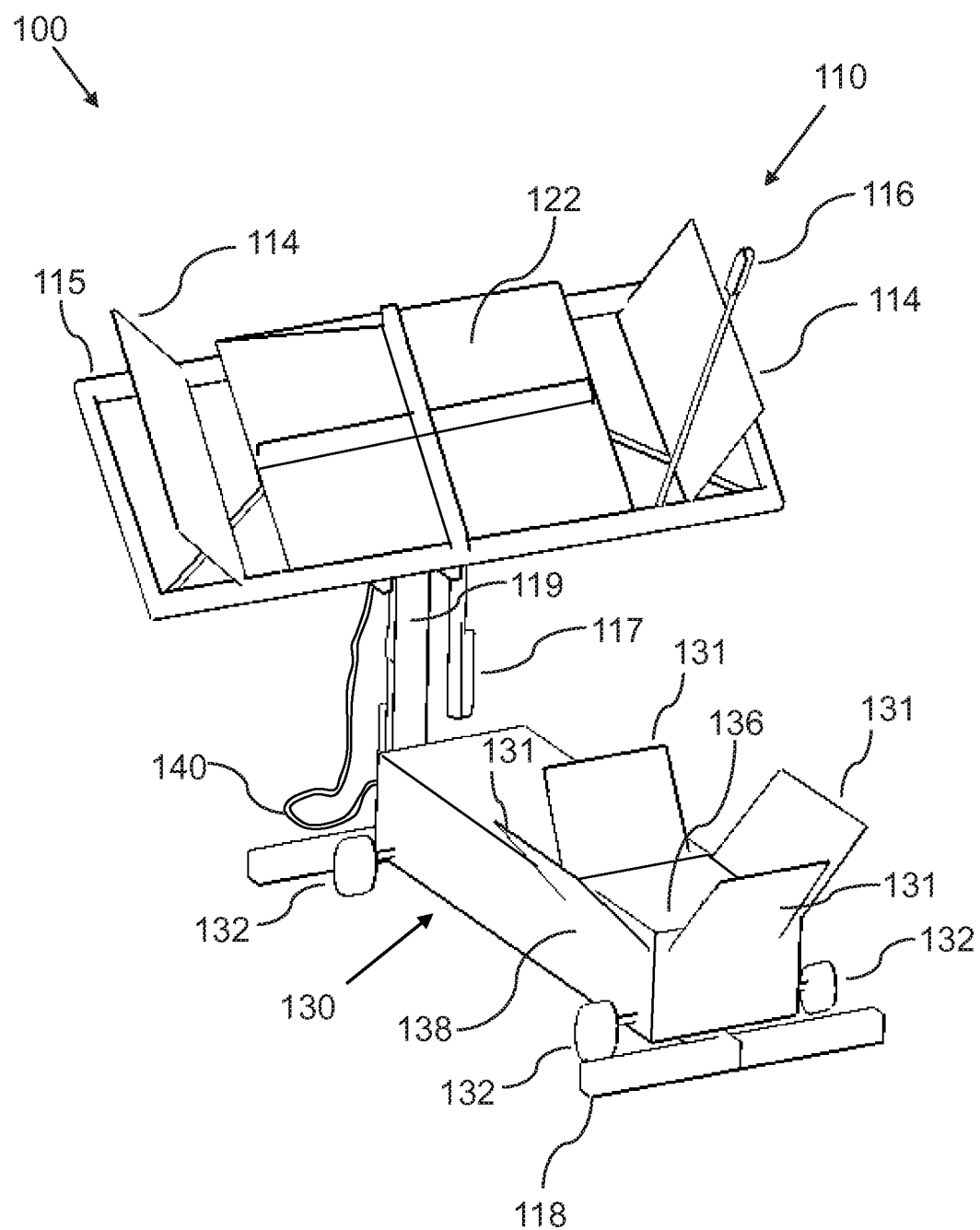
FIG. 1 illustrates a front perspective view of a photovoltaic intensification system, according to an embodiment of the invention.

Before describing the invention in detail, it should be observed that the present invention resides primarily in a novel and non-obvious combination of elements and process steps. So as not to obscure the disclosure with details that will readily be apparent to those skilled in the art, certain conventional elements and steps have been presented with lesser detail, while the drawings and specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive.

In the following, we describe the structure of an embodiment of a photovoltaic intensification system 100 with reference to FIG. 1, in such manner that like reference numerals refer to like components throughout; a convention that we shall employ for the remainder of this specification.

In an embodiment, as shown in FIG. 1, a photovoltaic intensification system 100 can include:

a. a solar array stand 110; further comprising:
  i. A mounting base 118, which can be positioned on a ground surface, and can further include 4 or more legs;
  ii. A mounting column 119, which is connected to the mounting base, such that it protrudes upwards from the ground surface;
  iii. A solar array frame 115;
  iv. A solar array 122; which is connected to a front side of the solar array frame 115;
  v. Solar array reflectors 114; which are connected to the front side of the solar array frame 115, to a right, left, top, or bottom side of the solar array 122;
  vi. A light sensor 116; which is connected to the solar array frame;
  vii. An elevation actuator 117; which is connected to the rear side of the solar array frame 115, such that it can move the solar array frame 115; and
b. A solar system cart 130, that is connected to the solar array stand 110 via a power cable 140, the solar system cart 130 further comprising:
  i. A cart enclosure 138;
  ii. A radiant solar cooker chamber 136, which is inside the cart enclosure 138, such that the radiant solar cooker chamber 136 is exposed to sun light via an enclosure aperture in the top of the cart enclosure;
  iii. Cart reflectors 131 attached to the cart enclosure, along the sides of the enclosure aperture, such that the car reflectors 131 reflect sun light to direct the sunlight through the enclosure aperture and hit the radiant solar cooker chamber;
  iv. Cart wheels 132, mounted on each of the 4 lower corners of the solar system cart 130, to ease transportation of the solar system cart 130.

The solar array 122, can also be referred to as a solar panel 122, and includes a plurality of photovoltaic elements, or modules, for generating electrical power by converting sunlight into direct current electricity using semiconducting materials that exhibit the photovoltaic effect.

In a related embodiment, the reflectors can be positioned at an optimal angle in relation to the solar array frame 115, such that that additional irradiance may channel to the modules.

In a related embodiment, the photovoltaic intensification system 100 can have an elevation actuator 117 that exert tractive forces on the array. The light sensors 116 may be mounted vertically on the solar array frame in order to receive reference light from all four directions.

In further related embodiments, the photovoltaic intensification system 100 can facilitate the intensification of photovoltaic cells by periodically aligning with the sun, a source of radiant energy. The photovoltaic intensification system 100 achieves this by receiving light intensity data from the light sensor 116 and relaying the results to a system controller, which via a processor is configured to control the elevation actuator 117 to perform heliostatic motions in the corresponding quadrant view of the sun, as the solar array frame 115 is tilted in the represented directions. The solar array reflectors 114 provide additional radiant exposure by concentrating light source onto the photovoltaic cell or like items.

In related embodiments, the combined efforts of the alignment of the solar array frame 115, and the concentration of the solar array reflectors 114, increase the efficiency of the solar array 122 above its initial efficiency rating. The radiant solar cooker chamber 136 can receive an increase in thermal energy by the concentration of radiant energy from the radiant cooker reflectors 131. The radiant cooker chamber can have a vent system to allow passive flow of air in and out of the cooker chamber. There can also be a temperate glass cover over or surrounding the cooker chamber to help maintain an adequate thermal setting of the enclosure.

In a related embodiment, construction of the mounting base 118 and the mounting column 119 can be made of powdered coated steel or similar type metals.

In related embodiments, the reflectors 114 and 131 can be made of glass mirrors, polished metal, or other highly reflective materials.

In a related embodiment, the solar system cart 130 can be constructed as a waterproof enclosure to maintain the integrity of the internal components.

In a related embodiment, the solar system cart 130 can further include an embedded refrigeration unit that allows thermal control of the internal environment of the photovoltaic intensification system 100.

In a related embodiment, the initial angle setting of the photovoltaic intensification system 100 can be locked.

In another related embodiment, the angle selection of the solar array reflectors 114 and the cart reflectors 131 can be adjustable, in both the latitudinal and longitudinal direction. For example, the initial angle setting of the reflectors 114 131 can be 45 degrees vertically, but the user can then change the angle of the reflectors to 70 degrees vertically.

In another embodiment, the utilization of reflectors as concentrators of solar irradiance may increase the thermal temperature of the array system, thereby making the electrical production less efficient. To overcome this reduction in efficiency the photovoltaic intensification system 100 can have an attached heat-exchanging unit, which readily receives cooling fluid, which transfers thermal energy away from the array system. Such a heat exchanging unit can be connected with series of thermal conductive piping materials such as copper or aluminum or other like metals. The cooling fluid may be water or similar fluid medium appropriate for transferring heat throughout a channel system.

Figure 2:
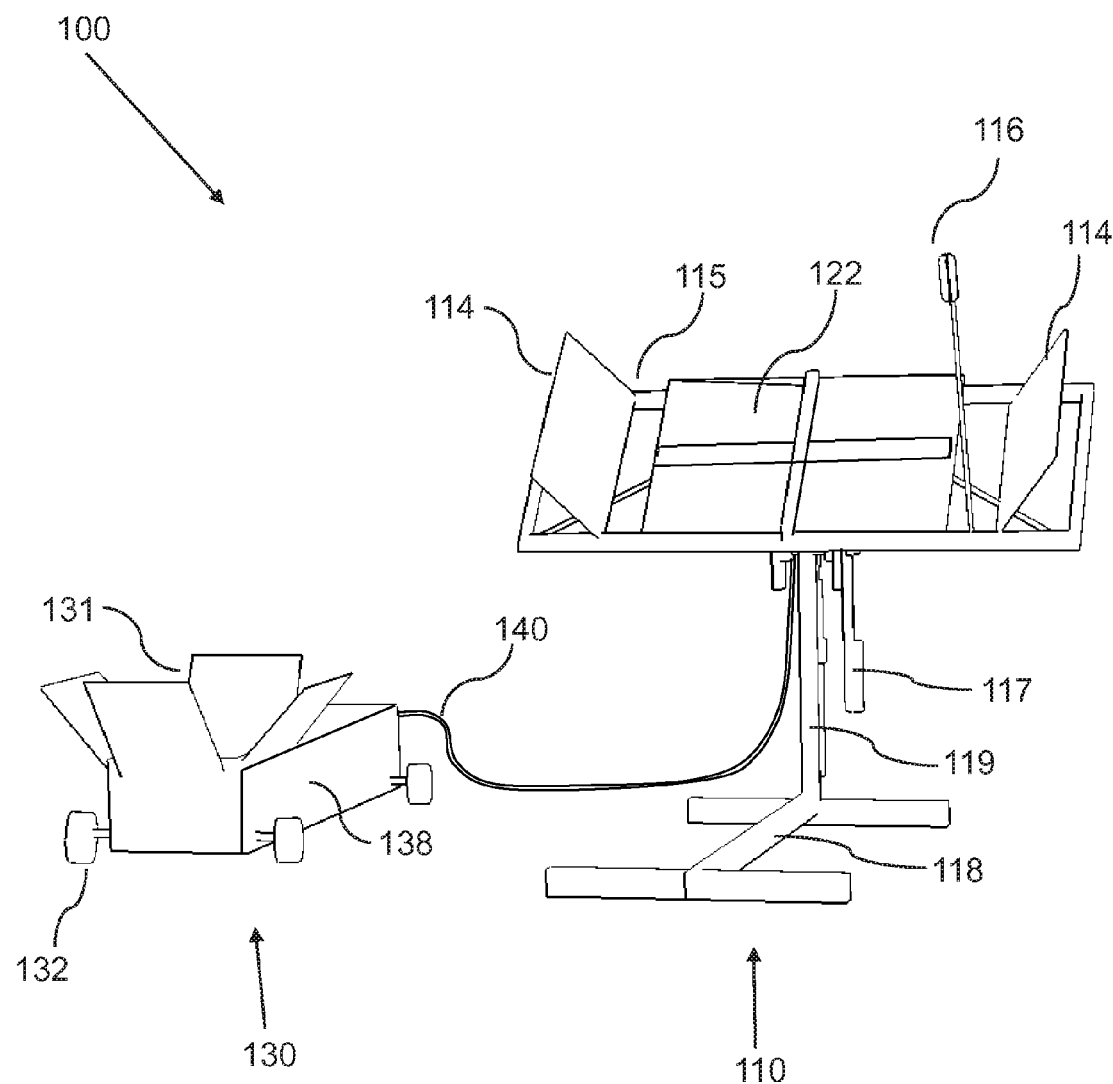
FIG. 2 illustrates a front perspective view of a photovoltaic intensification system, according to an embodiment of the invention.

In a related embodiment, as illustrated in FIG. 2, the solar system cart 130 can be detachable from the solar array stand 110. The solar system cart 130 can also be disconnected from the power cable 140, so it for example can be used in another location, away from the solar array stand 110. Thereby the solar system cart 130 can be completely mobile and fully detachable from the mounting base 118, which can allow using the embedded solar radiant cooker and embedded refrigerator at a different location than the location for the solar array stand 110.

In an embodiment, the photovoltaic intensification system cart 130 can be permanently connected to the photovoltaic intensification system 100 mounting base 118.

In an embodiment, the solar system cart 130 can include an installed backup battery bank, which will sustain the operation of the embedded refrigeration unit for a predetermined length of time. This function of the photovoltaic intensification system 100 will allow users to charge their solar system cart 130 when connected to the solar array stand 110, and then utilize the stored power when needed.

Figure 3:
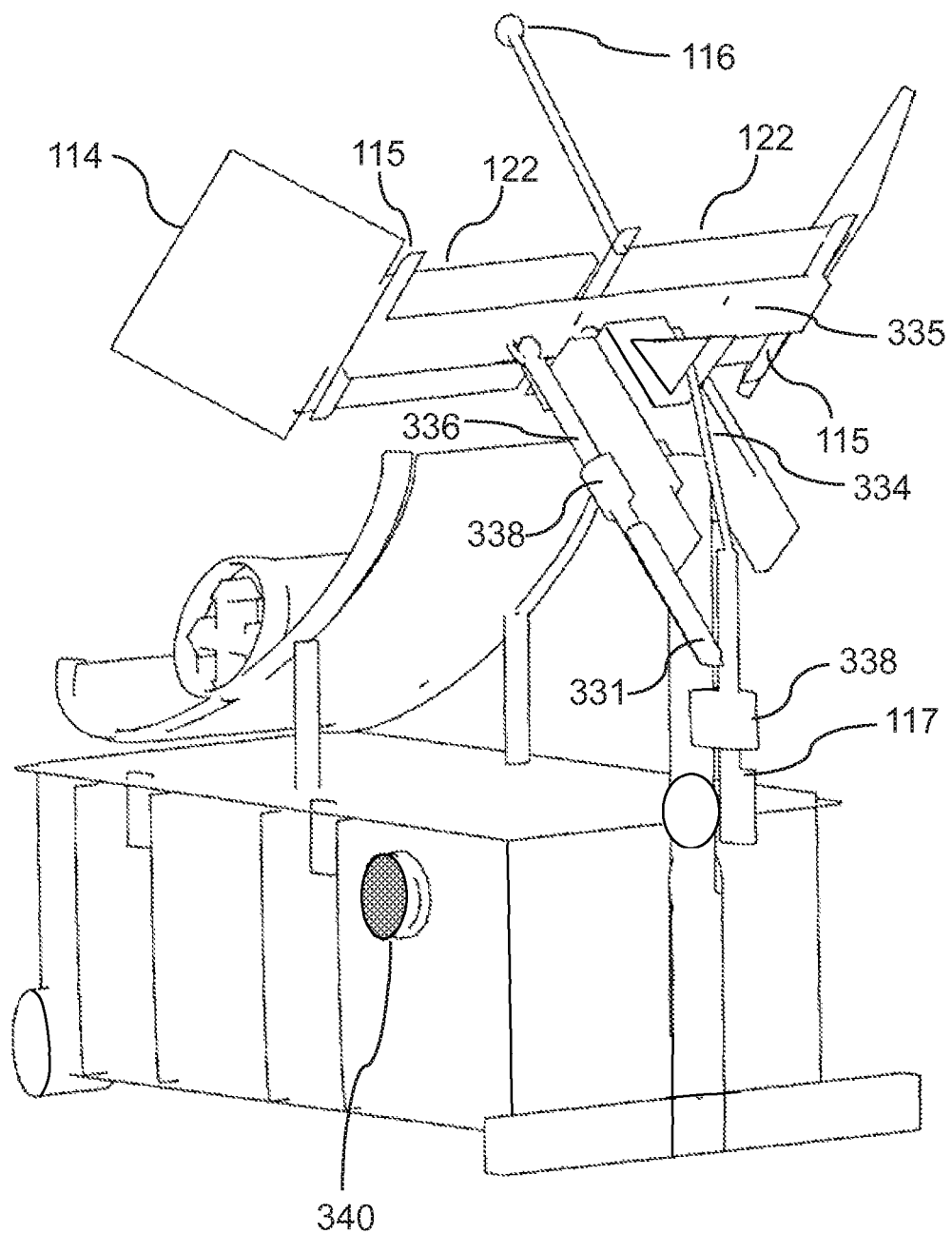
FIG. 3 illustrates a rear perspective view of a photovoltaic intensification system, according to an embodiment of the invention.

In an embodiment, the photovoltaic intensification system 100 can be manufactured with strength to resist ambient winds and elements of nature, with a light construction weight, and a mounting base 118 with four corners of support In an embodiment, as shown in FIG. 3, illustrating a rear view, the photovoltaic intensification system 100 can further include:
  a. an elevation actuator 117 that can move the solar array 122 in the north and south directions;
  b. an elevation rod 334 that is connected to the elevation actuator 117 and the strong arm of the center pivoting dock;
  c. a horizontal actuator 331, which can move the solar array 122 in the east and west directions;
  d. a horizontal rod 336 that is connected to the horizontal actuator 331 and a horizontal pivoting arm of the solar frame; and
  e. mounting brackets 338 for the actuators.

In a related embodiment, the light sensor 116 can calculate via a system control unit the various light intensities as radiant energy source navigates across different points of incidences. If the light source is on one side, then the light sensors will conduct a summation of all light intensities, and based upon the outcome, the signal is transferred to the processor and initiates the actuator 117 or 331 to move the solar array frame 115.

In a related embodiment, heat exchangers 335 can be mounted on the rear side of the solar array 122, such that the heat exchangers 335 receive cooling fluid that floods reservoir chambers of thermal channels in the heat exchangers 335, thus transferring heat away from the array system, whereby efficiency of the solar array 122 can be increased. The solar array reflectors 114, which can be adjustable, can be set to an optimal angle to add additional solar irradiance onto the solar array system.

In a related embodiment, constant sensor information with the current position of the sun can be provided by the light sensors 116. The light sensors can be calibrated, such that lack of efficiency due to system error can be mitigated.

In a related embodiment, the entire weight of the solar array 122 will rest on the solar array frame 115.

In a related embodiment, the elevation and horizontal actuators 117 331 can be environmentally sealed to protect from water damage and extremities of nature. However, if damage to the actuating motors were received, those skilled in the art would appreciate that the motors could be easily detached from the disclosed system by removing the mounting brackets 338, and installing a new actuating motor. Such an installation could take less than five minutes.

In a related embodiment, the photovoltaic intensification system 100 can further include a wireless speaker 340. The wireless speaker 340, can further include an amplifier, and can communicate via a wireless protocol, such as for example Bluetooth™ or WIFI, with a mobile device, such as a smart phone, such that it receives and plays music, radio programming, or other audio from the mobile device.

Figure 4:
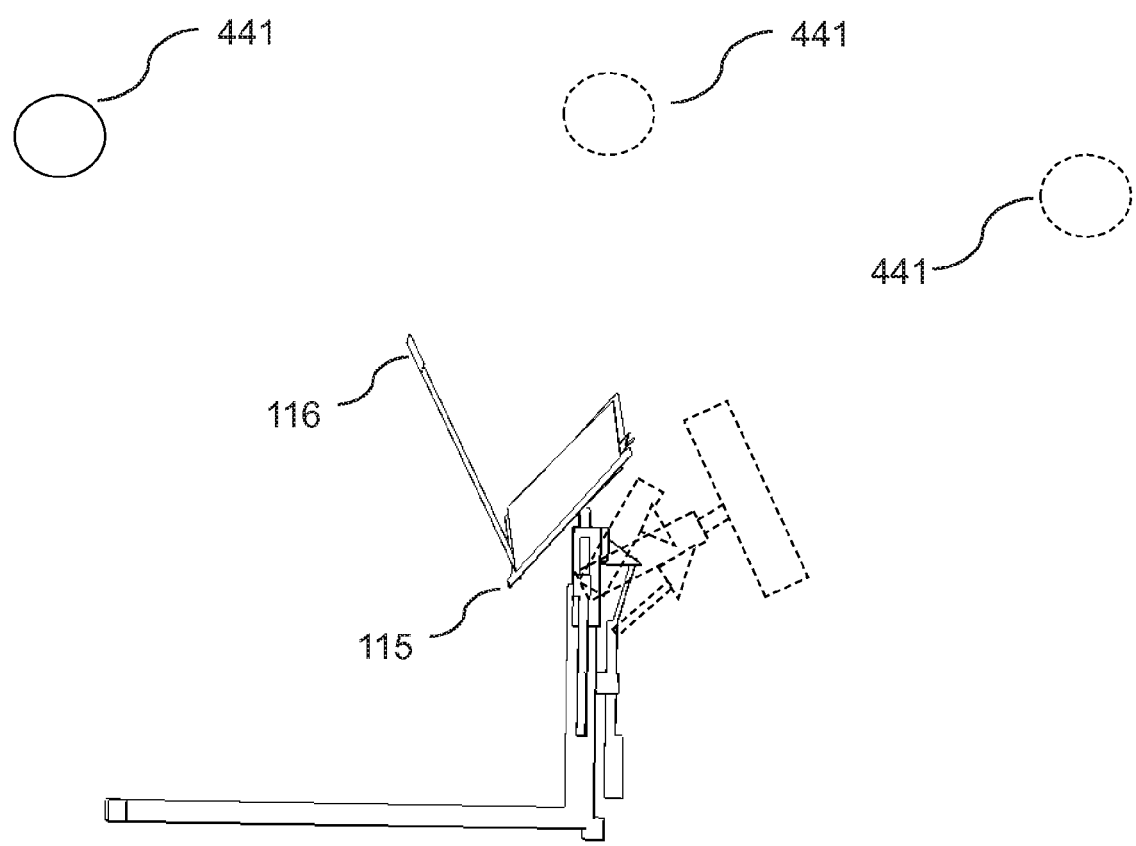
FIG. 4 illustrates a side view of the photovoltaic intensification system, according to an embodiment of the invention.

In a related embodiment, FIG. 4 shows a side view of the photovoltaic intensification system 100 with the sun 441, as it moves across the sky, the light sensor 116, and the solar array frame 115. The actuating movement of the elevation motor will navigate the array system in varying degrees of movement. This motion allows the photovoltaic intensification system 100 to track the sun, thereby exposing the array system of photovoltaic cell, solar thermal modules and the like to higher levels of solar irradiance.

Figure 5:
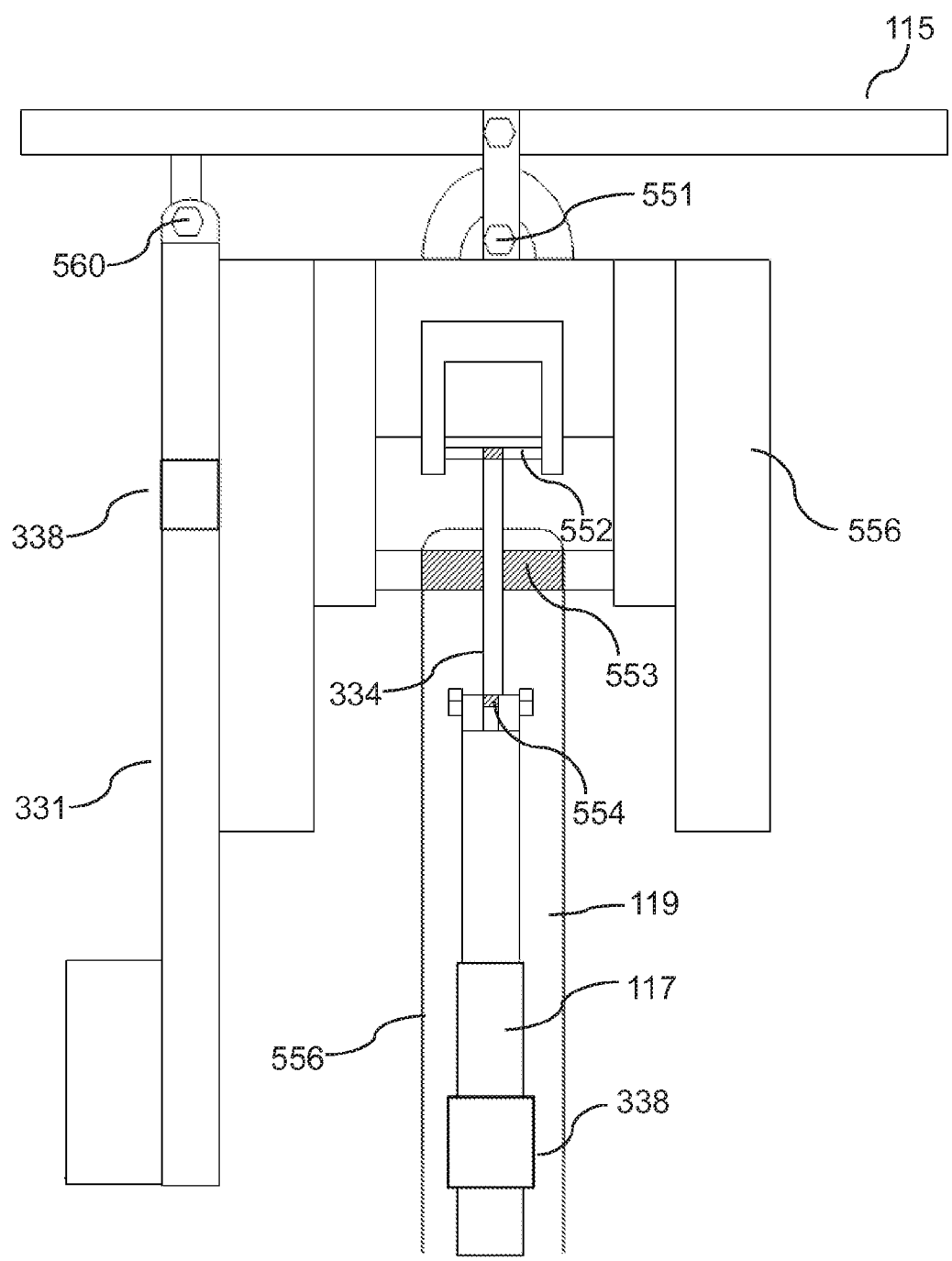
FIG. 5 is a schematic diagram illustrating a cropped back view of the photovoltaic intensification system, according to an embodiment of the invention.

In a related embodiment, FIG. 5 shows a cropped rear cross-sectional view of a section of the photovoltaic intensification system 100, including:
  a. A horizontal tilt ring 551, which is connected to the solar frame 115 in a left-right center position, and further connects to an upper mount body 556;
  b. a strong arm rod 552, which is connected to the upper mount body 556;
  c. a mass pivot rod 553, which pivotally connects the strong arm rod 552 with the mounting column 119;
  d. an elevation actuating ring 554;
  e. an elevation actuator 117, such that the elevation actuating ring 554 pivotally connects the mass pivot rod 553 with the elevation actuator 117, which is mounted to the mounting column 119;
  f. a horizontal actuating ring 560, which is connected to the solar frame 115 in a left-right off-center position;
  g. a horizontal actuator 331; which is connected in an upper end via the horizontal actuating ring 560 to the solar frame 115; and
  h. mounting brackets 338; which connect the elevation actuator 117 and the horizontal actuator 331 to the mounting column 119;
  such that when the light sensors receive photo details of sunlight direction, the signal will be transmitted to the microprocessor, and the preset algorithm will be executed. Upon that, if the light is projected from the East or West, the horizontal actuator 331 can initiate, pulsing the horizontal actuating ring 560, which is connected to the solar array frame 115, in the desired orientation to the sunlight. The solar array frame 115 may be tilted in either directions of the horizontal plane by utilizing the tilting movements of the horizontal tilt ring 551.

In a related embodiment, again referring to FIG. 5, when the light sensor 116 (not shown in FIG. 5) receives sensor information regarding the position of the sunlight in the vertical plane of North and South, the signal can be sent to a control unit, and upon executing a preset algorithm, initiate the elevation actuator 117 which can pulse the elevator actuating ring 554 to a defined position, which will push the elevation rod 334, thereby applying a leveraged force on the strong arm rod 552, thereby causing a rotation of the upper mount body 556, around the mass pivot rod 553, which causes the tilting of the solar array frame 115 in either directions of the vertical plane.

In a related embodiment, the mass pivot rod 553 can facilitate full tilting movement of the solar frame 115 in either vertical directions by supplying evenly distributed supports and controlling the stroke of the complete movement.

Figure 6:
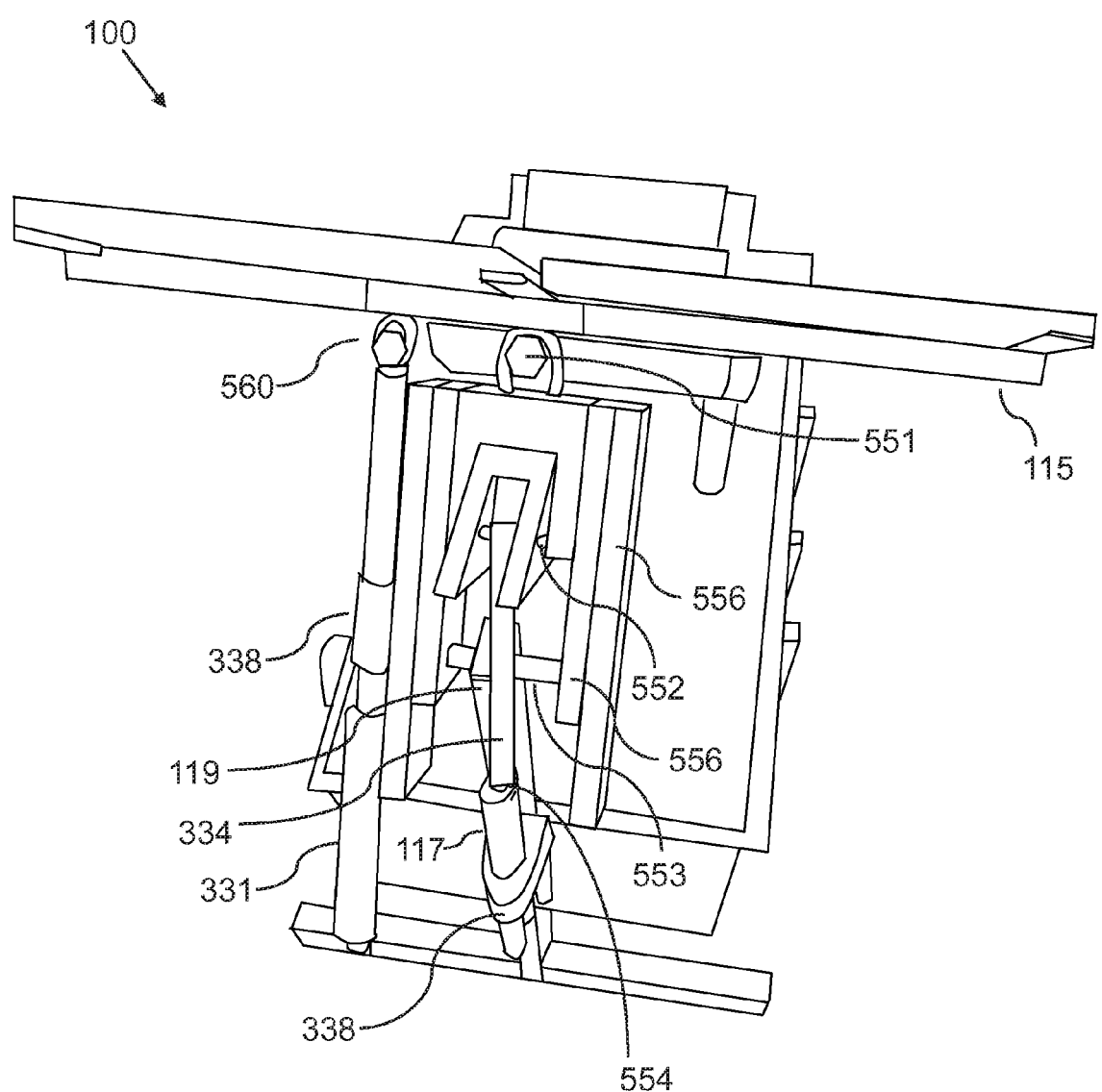
FIG. 6 illustrates a rear perspective view of a photovoltaic intensification system, according to an embodiment of the invention.

In a related embodiment, FIG. 6 shows a rear perspective view of the photovoltaic intensification system 100, illustrating the components described above in reference to FIG. 5.

Figure 7:
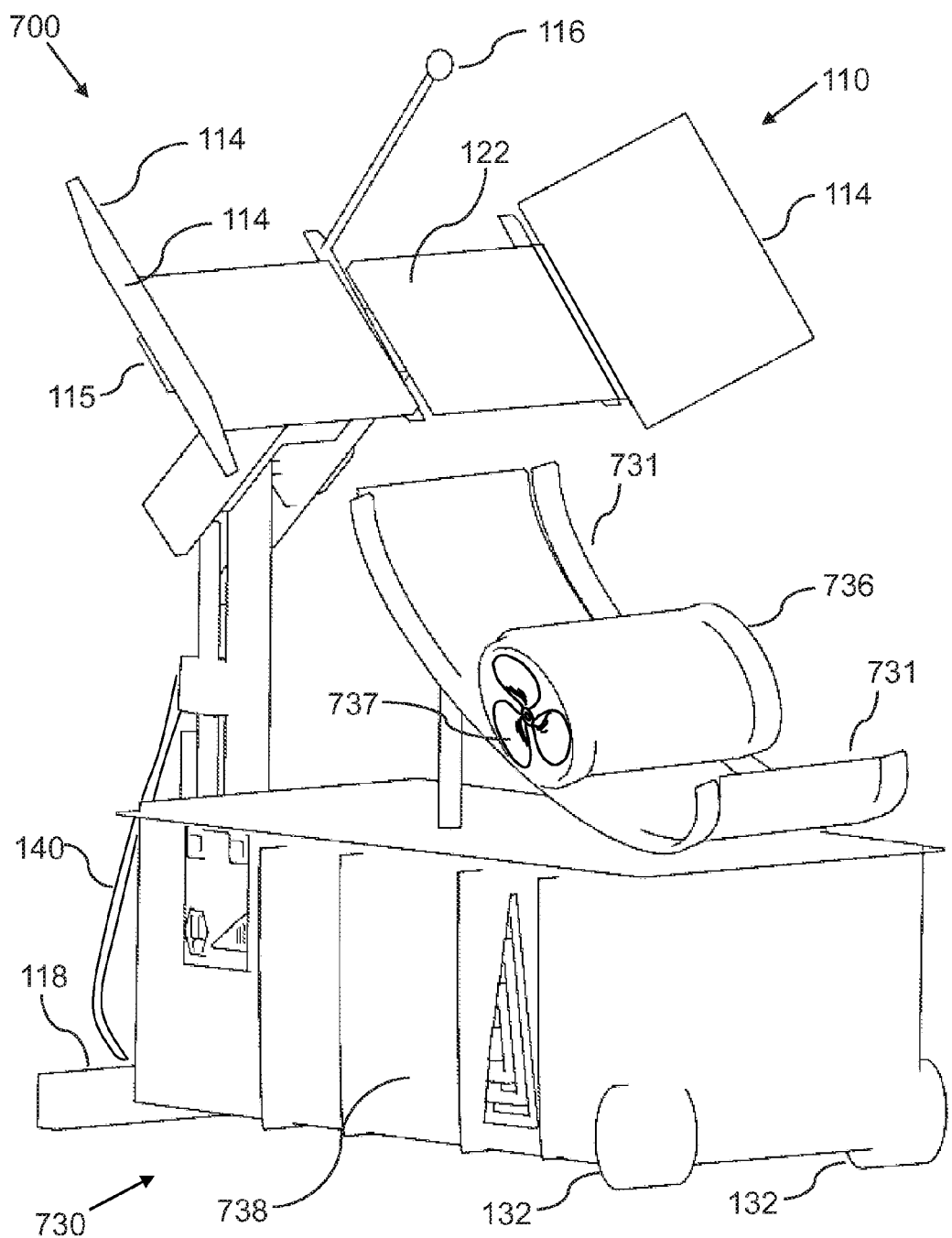
FIG. 7 illustrates a front perspective view of a photovoltaic intensification system, according to an embodiment of the invention.

In an embodiment, FIG. 7 shows an alternative embodiment of a photovoltaic intensification system 700, including:
 a. A solar array stand 110, such as described above, and shown in FIG. 1;
 b. A solar system cart 730, that is connected to the solar array stand 110 via a power cable 140, the solar system cart 730 further comprising:
  i. A cart enclosure 738;
  ii. A radiant solar cooker chamber 736, which is mounted on the outside of the cart enclosure 738, such that the radiant solar cooker chamber 736 is exposed to sun light via translucent walls of the radiant solar cooker chamber 736;
  iii. A cart reflector 731 attached to the cart enclosure 738, along the sides of the enclosure aperture, such that the cart reflector 731 reflects sun light to direct the sunlight through the enclosure aperture and hit the radiant solar cooker chamber 736;
  iv. Cart wheels 132, which can be mounted on each of the 2 front lower corners of the solar system cart 730, to ease transportation of the solar system cart 730. The cart wheels 132 can optionally also be mounted in the 2 rear lower corners, such as shown in FIG. 1.

In a related embodiment, the radiant solar cooker chamber 736 can include at least one solar cooker fan 737, which can serve to dehydrate items in the solar cooker chamber 736 and/or reduce the temperature of the radiant solar cooker chamber 736.

In a related embodiment, the translucent walls of the radiant solar cooker chamber 736 can be made of a transparent material, such as glass or heat resistant plastic. In an example embodiment, the translucent walls of the radiant solar cooker chamber 736 can be made of borosilicate glass, in the form of heat resistant compositions of glass including silica and boron trioxide, available under a plurality of trade names, such as Borcam, Borosil, Suprax, Kimax, Pyrex, Endural, Schott, and Refmex.

Figure 8:
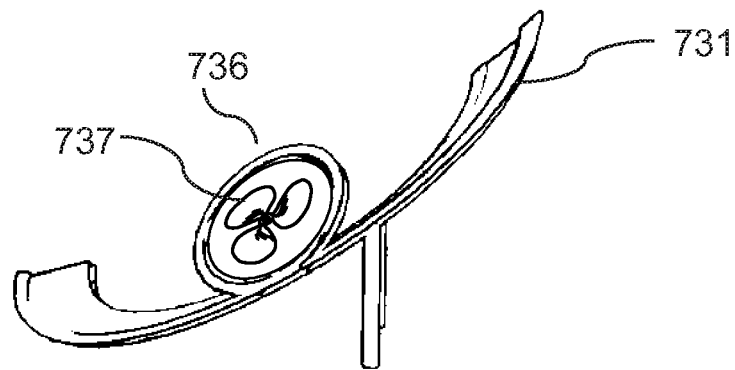
FIG. 8 illustrates a side view of a folded out cart reflector, according to an embodiment of the invention.
Figure 9:
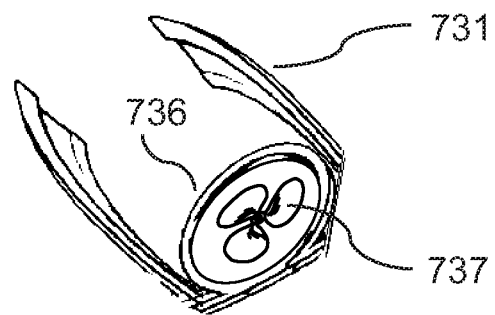
FIG. 9 illustrates a side view of a folded up cart reflector, according to an embodiment of the invention.

In a related embodiment, the cart reflector 731 can be configured to fold up, whereby the cart reflector 731 can be positioned in a compartment of the cart enclosure 738 for storage and transport. FIG. 8 shows a folded out cart reflector 731, and FIG. 9 shows a folded up cart reflector 731.

Figure 10:
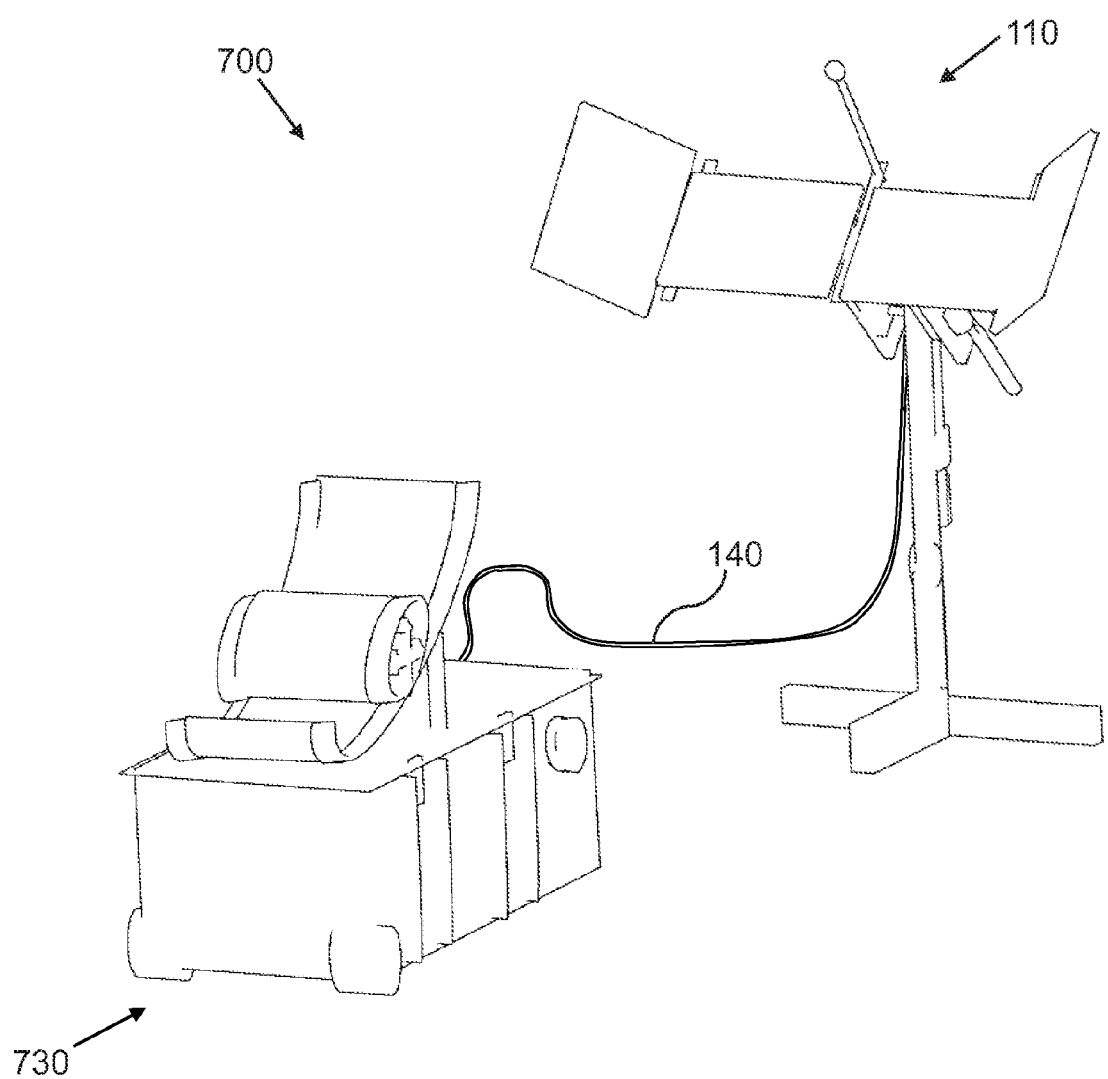
FIG. 10 illustrates a front perspective view of a photovoltaic intensification system, according to an embodiment of the invention.

In a related embodiment, as illustrated in FIG. 10, the solar system cart 730 can be removed from the solar array stand 110. The solar system cart 730 can also be disconnected from the power cable 140, so it for example can be used in another location, away from the solar array stand 110.

Figure 11:
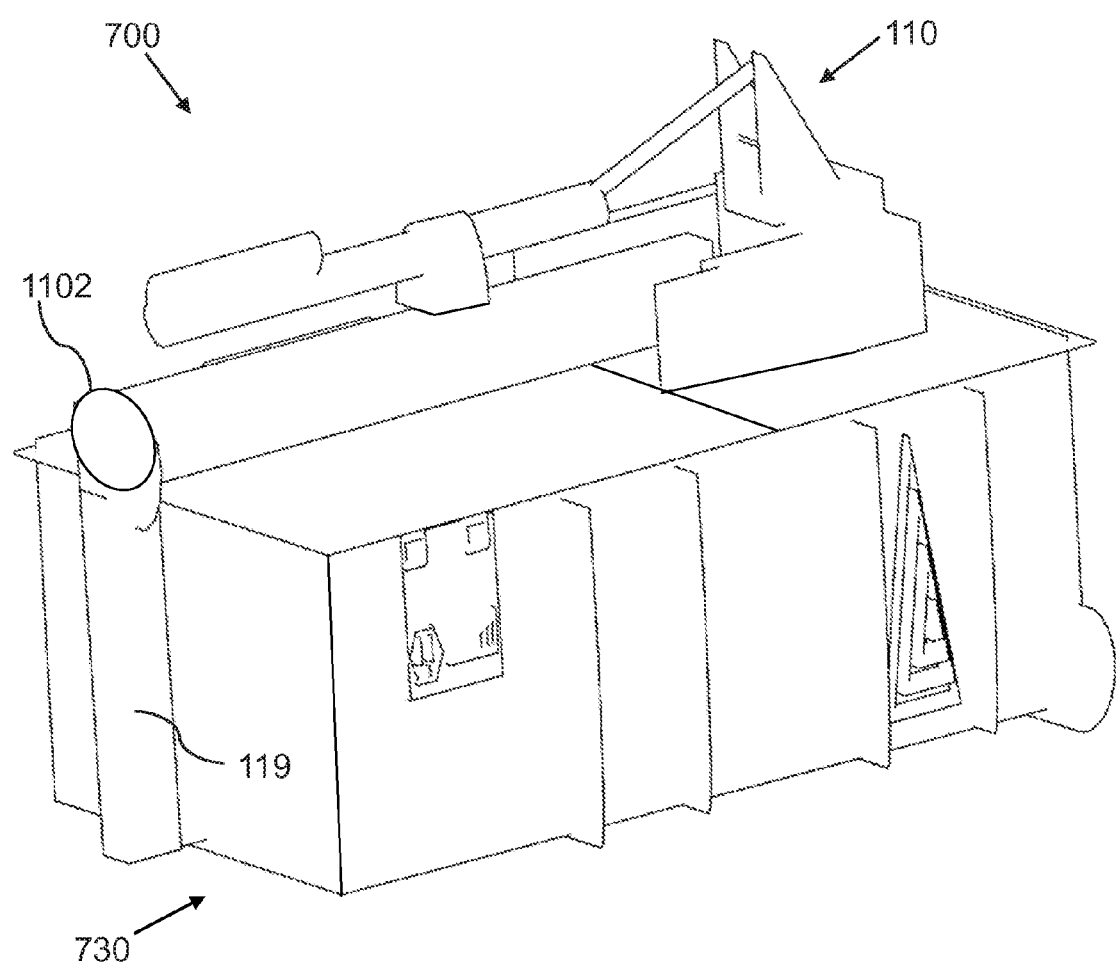
FIG. 11 illustrates a rear perspective view of a photovoltaic intensification system, according to an embodiment of the invention

In a related embodiment, as illustrated in FIG. 11, the solar array stand 110 can be folded on to the solar system cart 730, via bending the mounting column 119, in a pivotal point 1102, whereby the photovoltaic intensification system 700 can be configured for storage or transportation.

In related embodiments, the weight of the solar array frame 115 and thereto-connected components may be supported by the mounting column 119.

In related embodiments, movement of the solar array frame 115 can be facilitated by a lightweight construction of the solar array 122, and related components, such that, in conjunction with a high efficiency of the photovoltaic intensification system 100, the number of solar modules needed in the solar array 122 is reduced significantly.

In the various related embodiments of the photovoltaic intensification system 100, those skilled in the art may appreciate the absence of the slew drive, which adds considerable cost and weight to typical solar tracking systems. Related embodiments of the photovoltaic intensification system 100 use actuating motors to manipulate the solar array frame 115 in a full three dimensional movement without a slew drive. This is possible because the mass pivot rod 553, is included as a rod with an appropriate diameter for the elongated bore, which allows the flexibility and reinforced support of the full weight of the solar array system in any direction of its three dimensional motions.

In another embodiment, the three dimensional movements of the photovoltaic intensification system 100 can be facilitated by the unique design of the strong arm rod 552, the mass pivot rod 553, and the elevation rod 334 that transfers the full load of the assembled system from a sub-surface or ground area to the four legs of the mounting column base 118. Furthermore, the mass pivot rod 553 can be constructed of suitable metals, such as steel, or other high-strength materials, such as carbon fiber or composites.

Figure 16:
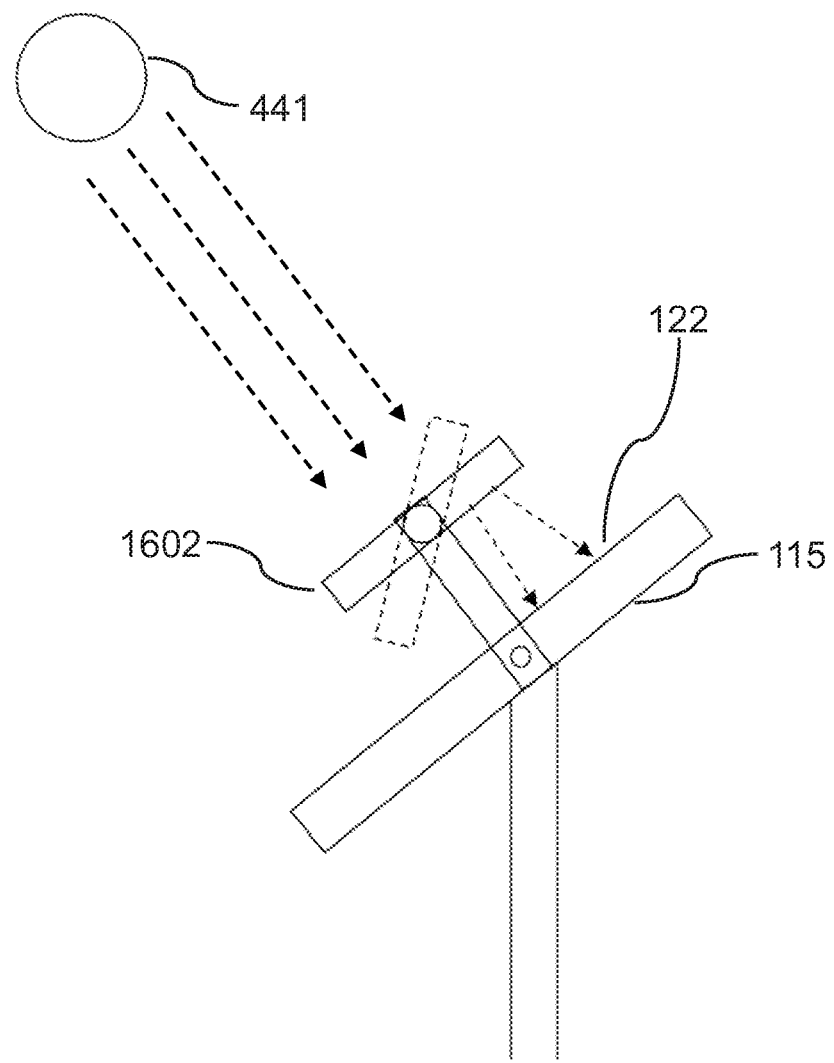
FIG. 16 illustrates a side cross-sectional view of a solar array with an optical lens, according to an embodiment of the invention.

In a related embodiment, the photovoltaic intensification system 100 can include a solar array concentrator, which can be either a solar array reflector 114 or, as shown in FIG. 16, an optical lens 1602, or a combination of solar array reflectors 114, and optical lenses 1602. The optical lens 1602 can be configured to direct light onto the solar array 122.

In a related embodiment, as shown in FIG. 16, the position and angulation of the solar array concentrator, here shown in the form of an optical lens 1602, can be adjustable.

Figure 17:
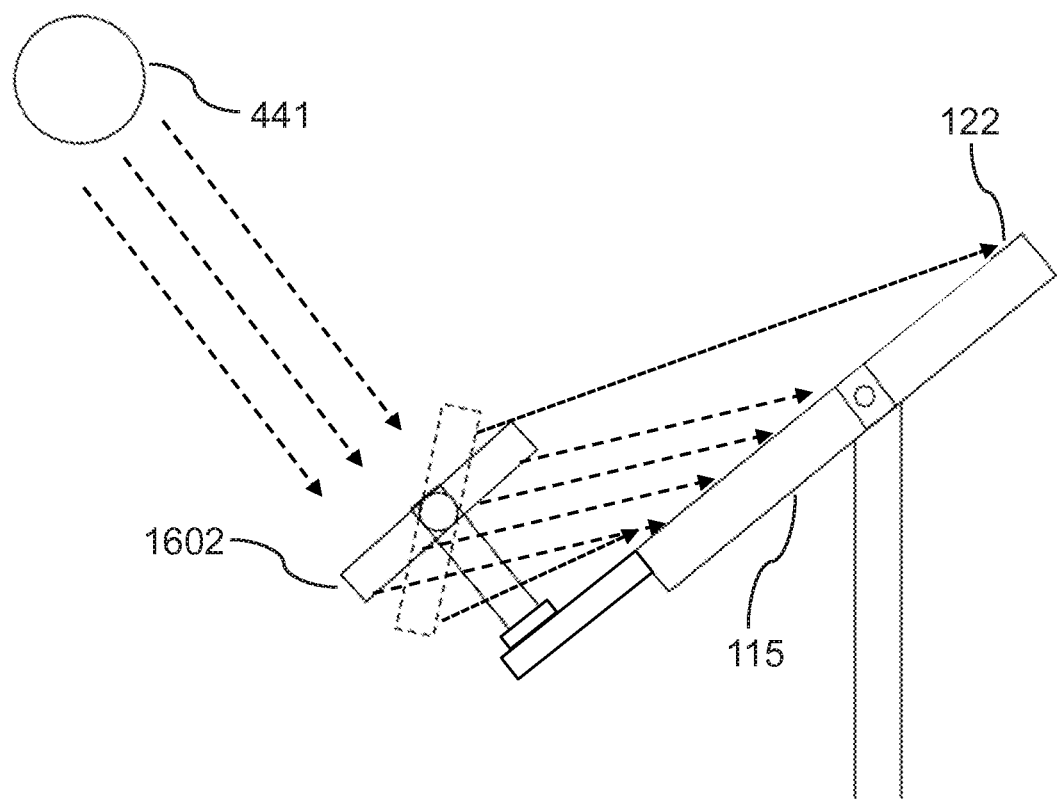
FIG. 17 illustrates a side cross-sectional view of a solar array with an optical lens, according to an embodiment of the invention.

FIG. 17 illustrates a further related embodiment, wherein the optical lens 1602 directs light from a side of the solar array 122 onto the solar array 122.

In various related embodiments, the present invention can function as a device that allows consumers to intensify power output from a photovoltaic cell. The related embodiments of the present invention are also capable of being used as a power supply that can be used by a consumer at work or in the home. The power supply can be used to power televisions, charge portable devices, and provide power for lights or any device suitable for use with the power system.

In an example embodiment, the integrated photovoltaic intensification system can include a maximum power point tracking charge controller, a 5 port USB power hub, a 24 volt 35AH battery bank, a 240 W scalable solar polycrystalline array, a 24 volt 100 meter Head lift water pump, a 32° F. 12 cu Feet thermal electric freezer, a 12 cu Feet 250° F. solar cooker for cooking and drying foods, and a 0.01 micron water filtration system.

Figure 15:
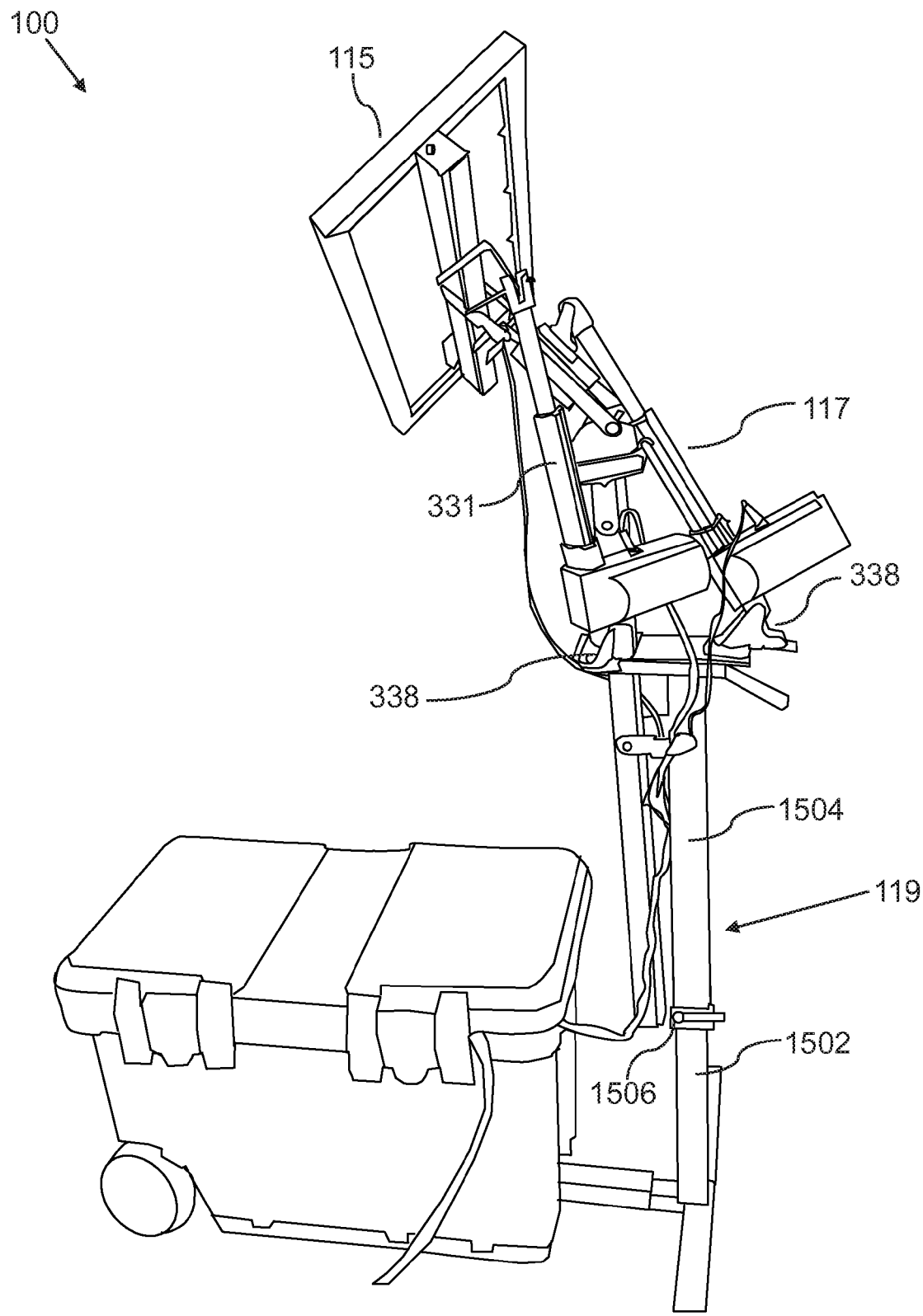
FIG. 15 illustrates a side perspective view of a photovoltaic intensification system, according to an embodiment of the invention.

In an alternative embodiment, as illustrated in FIG. 15, the mounting column 119 can be telescoping, such that a lower part 1502 of the mounting column 119 can slide in and out of an upper part 1504 of the mounting column, thereby adjusting the height of the mounting column 119, thereby adjusting the height of the solar frame 115. The mounting column can further include a locking mechanism 1506, to lock the lower and upper parts 1502 1504 in place.

In a related alternative embodiment, as illustrated in FIG. 15, the mounting brackets 338 can pivot, such that both the elevation actuator 117 and the horizontal actuator 331 are rotationally attached to the mounting column 119.

Figure 12:
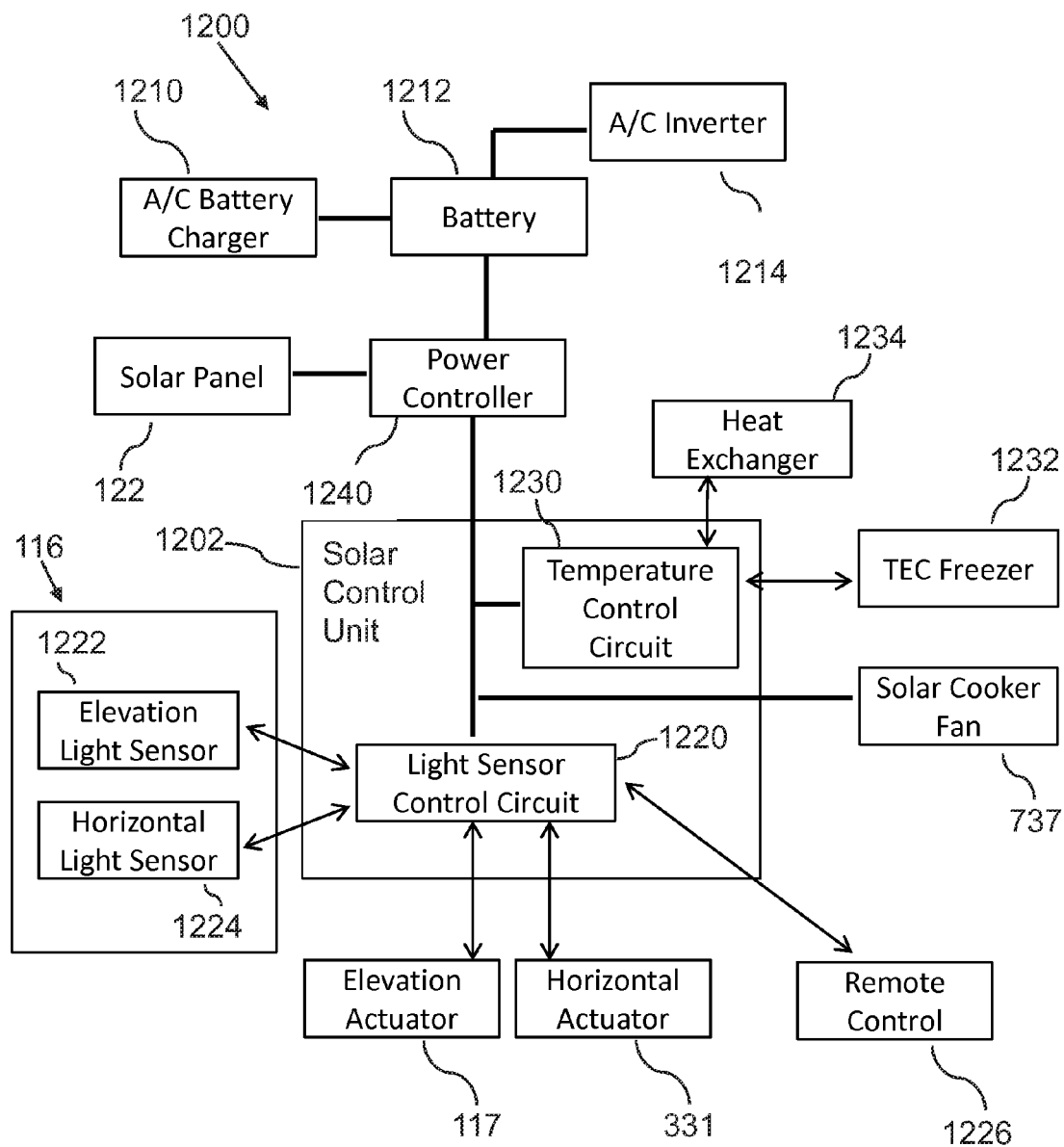
FIG. 12 is a schematic diagram of a power and control system for photovoltaic Intensification, according to an embodiment of the invention.

In an embodiment, as illustrated in FIG. 12, a power and control system for photovoltaic intensification 1200 can include:
- a. A solar array 122;
- b. A battery charger 1210, which can be plugged into an AC outlet, such as 110 volt or 220 volt, in a house or from a generator, to maintain a float charge on batteries while in storage or to quickly charge the unit;
- c. A power controller 1240; which controls power from the solar array 122;
- d. A battery 1212, which is charged by the battery charger 1210 or the solar array 122, via the power controller 1240;
- e. An A/C Inverter 1214, which converts direct current from the battery 1212 to alternating current for external use, and may connect the system to an electrical grid;
- f. A solar control unit 1202, which receives power from the battery 1212, via the power controller 1240;
- g. A light sensor module 116, which further includes:
  - i. An elevation light sensor 1222; and
  - ii. A horizontal light sensor 1224;
- h. An elevation actuator 117, which is controlled by the solar control unit 1202;
- i. A horizontal actuator 331, which is controlled by the solar control unit 1202;
- j. A remote control 1226, which communicates with the solar control unit 1202 to control the elevation actuator 117 and the horizontal actuator 331;
- k. A thermo electric freezer (TEC freezer) component 1232, which is controlled by the solar control unit 1202. The TEC freezer component 1232 uses the Peltier effect to cool a surface by application of electric power, such that the TEC freezer can be configured to cool a fridge compartment within the solar system cart 130.

In an embodiment, as illustrated in FIG. 12, wherein the solar control unit 1202 is implemented by non-programmable electronic circuits, a solar control unit 1202 can include:
- a. A light sensor control circuit 1220, which receives sensor input from the elevation light sensor 1222 and the horizontal light sensor 1224, and is connected to and controls the elevation and horizontal actuators 117 331;
- b. A temperature control circuit 1230, such that the temperature control circuit 1230 is connected to and controls the TEC freezer 1232, which can reduce the temperature of a fridge compartment; and such that the temperature control circuit 1230 is connected to and controls the heat exchanger 1234, which can reduce the temperature of the solar array 122.

Figure 13:
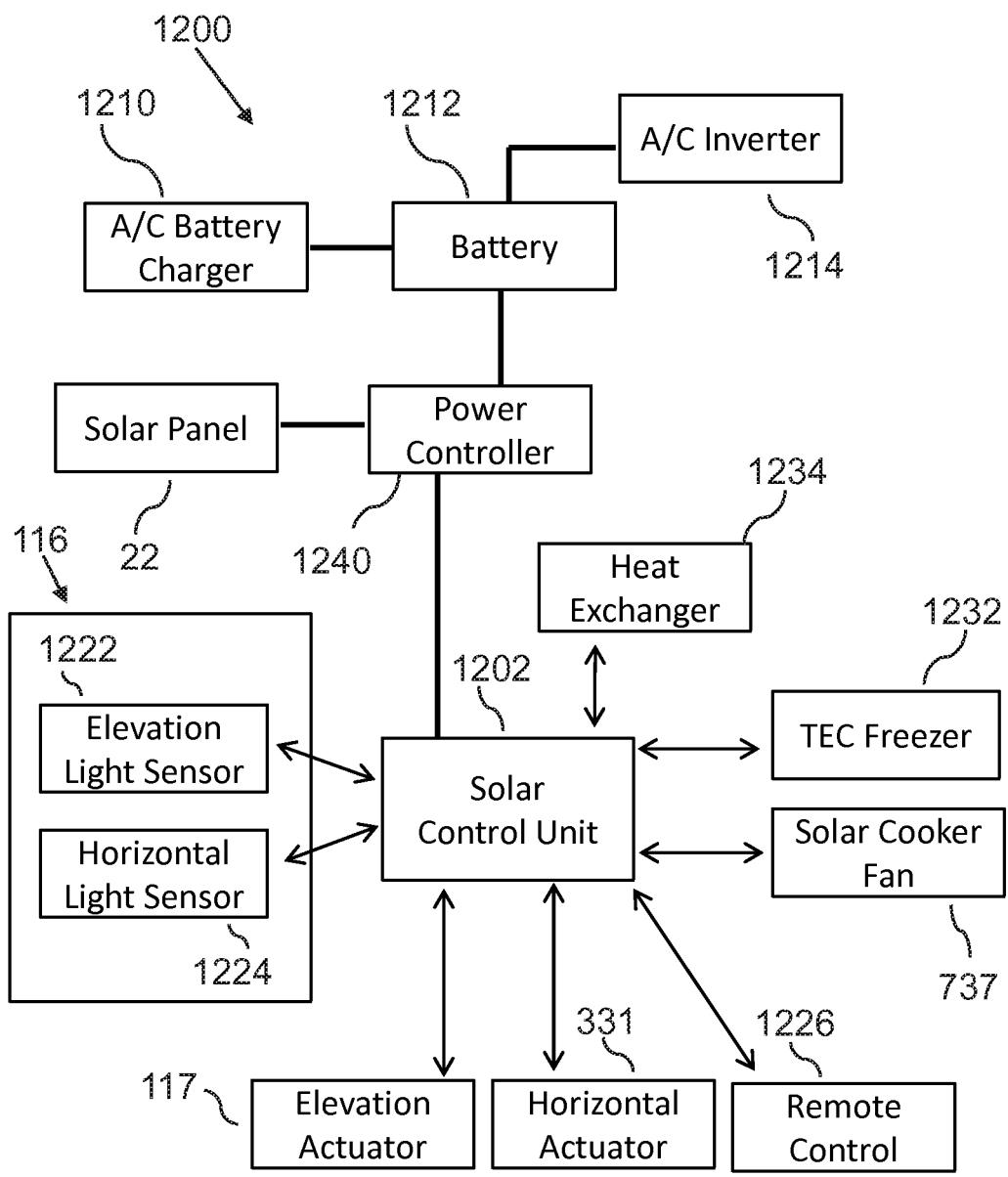
FIG. 13 is a schematic diagram of a power and control system for photovoltaic Intensification, according to an embodiment of the invention.
Figure 14:
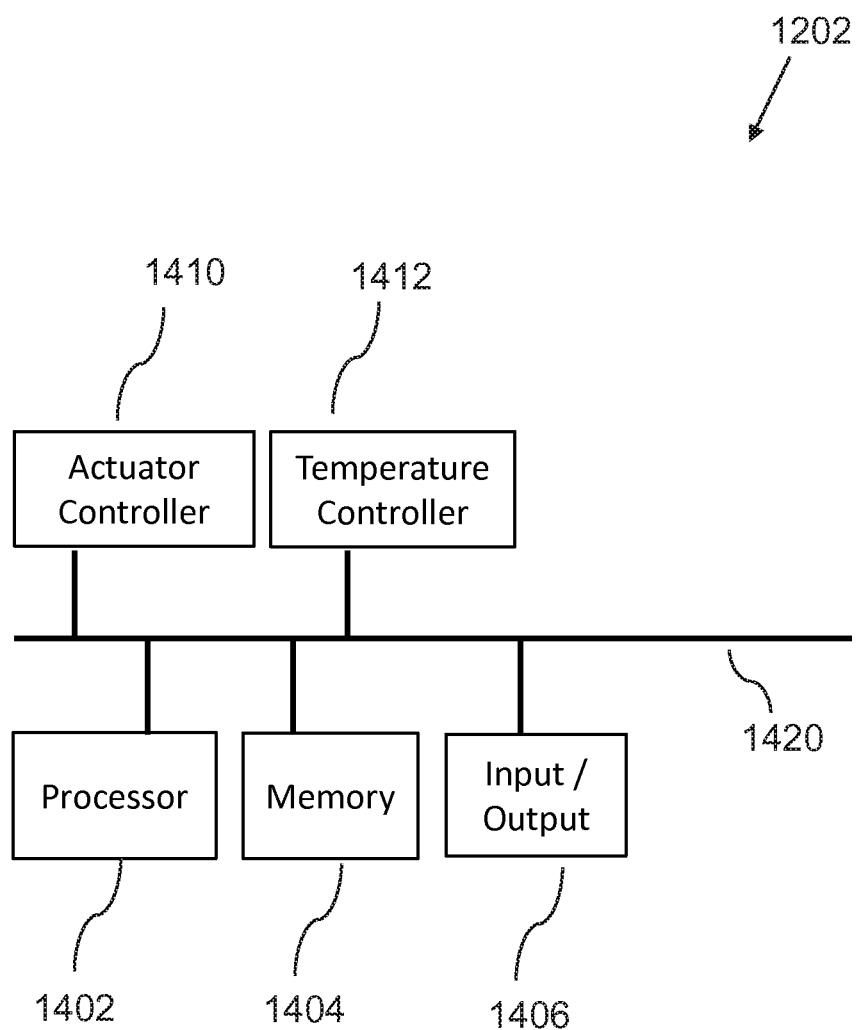
FIG. 14 is a schematic diagram of a solar control unit, according to an embodiment of the invention.

In an embodiment, as illustrated in FIG. 13, wherein the solar control unit 1202 is implemented by non-programmable electronic circuits, the solar control unit 1202, as illustrated in FIG. 14, can include:
- a. A processor 1402;
- b. A non-transitory memory 1404;
- c. An input/output 1406;
- d. An actuator controller 1410; and
- e. A temperature controller 1412;

Wherein the actuator controller 1410 receives sensor input from the light sensor 116, and controls the elevation actuator 117 and the horizontal actuator 331; and wherein the temperature controller 1412 can be configured to control the thermo electric freezer component 1232 and the heat exchanger 1234.

FIGS. 12 and 13 are block diagrams that include devices, systems, apparatuses, and computer program products according to various embodiments of the present invention. It shall be understood that each block or step of the block diagram, flowchart and control flow illustrations, and combinations of blocks in the block diagram, flowchart and control flow illustrations, can be implemented by computer program instructions or other means. Although computer program instructions are discussed, an apparatus or system according to the present invention can include other means, such as hardware or some combination of hardware and software, including one or more processors or controllers, for performing the disclosed functions.

In this regard, FIGS. 12 and 13 depict the computer devices of various embodiments, each containing several of the key components of a general-purpose computer by which an embodiment of the present invention may be implemented. Those of ordinary skill in the art will appreciate that a computer can include many components. However, it is not necessary that all of these generally conventional components be shown in order to disclose an illustrative embodiment for practicing the invention. The general-purpose computer can include a processing unit and a system memory, which may include various forms of non-transitory storage media such as random access memory (RAM) and read-only memory (ROM). The computer also may include nonvolatile storage memory, such as a hard disk drive, where additional data can be stored.

It shall be understood that the above-mentioned components of the solar control unit 1202 are to be interpreted in the most general manner.

For example, the processor 1402 can include a single physical microprocessor or microcontroller, a cluster of processors, a datacenter or a cluster of datacenters, a computing cloud service, and the like.

In a further example, the non-transitory memory 1404 can include various forms of non-transitory storage media, including random access memory and other forms of dynamic storage, and hard disks, hard disk clusters, cloud storage services, and other forms of long-term storage. Similarly, the input/output 1406 can include a plurality of well-known input/output devices, such as screens, keyboards, pointing devices, motion trackers, communication ports, and so forth.

Furthermore, it shall be understood that the solar control unit 1202 can include a number of other components that are well known in the art of general computer devices, and therefore shall not be further described herein. This can include system access to common functions and hardware, such as for example via operating system layers such as Windows, Linux, and similar operating system software, but can also include configurations wherein application services are executing directly on server hardware or via a hardware abstraction layer other than a complete operating system.

An embodiment of the present invention can also include one or more input or output components, such as a mouse, keyboard, monitor, and the like. A display can be provided for viewing text and graphical data, as well as a user interface to allow a user to request specific operations. Furthermore, an embodiment of the present invention may be connected to one or more remote computers via a network interface. The connection may be over a local area network (LAN) wide area network (WAN), and can include all of the necessary circuitry for such a connection.

In a related embodiment, the solar control unit 1202 can communicate with components of the power and control system for photovoltaic intensification 1200 over a network, a set of network connections, or direct connections, which can include the general Internet, a Wide Area Network or a Local Area Network, or another form of communication network, transmitted on wired or wireless connections. Wireless networks can for example include Ethernet, Wi-Fi, Bluetooth, ZigBee, and NFC.

Typically, computer program instructions may be loaded onto the computer or other general-purpose programmable machine to produce a specialized machine, such that the instructions that execute on the computer or other programmable machine create means for implementing the functions specified in the block diagrams, schematic diagrams or flowcharts. Such computer program instructions may also be stored in a computer-readable medium that when loaded into a computer or other programmable machine can direct the machine to function in a particular manner, such that the instructions stored in the computer-readable medium produce an article of manufacture including instruction means that implement the function specified in the block diagrams, schematic diagrams or flowcharts.

In addition, the computer program instructions may be loaded into a computer or other programmable machine to cause a series of operational steps to be performed by the computer or other programmable machine to produce a computer-implemented process, such that the instructions that execute on the computer or other programmable machine provide steps for implementing the functions specified in the block diagram, schematic diagram, flowchart block or step.

Accordingly, blocks or steps of the block diagram, flowchart or control flow illustrations support combinations of means for performing the specified functions, combinations of steps for performing the specified functions and program instruction means for performing the specified functions. It will also be understood that each block or step of the block diagrams, schematic diagrams or flowcharts, as well as combinations of blocks or steps, can be implemented by special purpose hardware-based computer systems, or combinations of special purpose hardware and computer instructions, that perform the specified functions or steps.

As an example, provided for purposes of illustration only, a data input software tool of a search engine application can be a representative means for receiving a query including one or more search terms. Similar software tools of applications, or implementations of embodiments of the present invention, can be means for performing the specified functions. For example, an embodiment of the present invention may include computer software for interfacing a processing element with a user-controlled input device, such as a mouse, keyboard, touch screen display, scanner, or the like. Similarly, an output of an embodiment of the present invention may include, for example, a combination of display software, video card hardware, and display hardware. A processing element may include, for example, a controller or microprocessor, such as a central processing unit (CPU), arithmetic logic unit (ALU), or control unit.

The many features and advantages of the invention are apparent from the detailed specification, and thus, it is intended by the appended claims to cover all such features and advantages of the invention, which fall within the true spirit and scope of the invention.

Many such alternative configurations are readily apparent, and should be considered fully included in this specification and the claims appended hereto. Accordingly, since numerous modifications and variations will readily occur to those skilled in the art, it is not desired to limit the invention to the exact construction and operation illustrated and described, and thus, all suitable modifications and equivalents may be resorted to, falling within the scope of the invention.

What is claimed is:

1. A photovoltaic intensification system, comprising:
   a. a solar array stand; further comprising:
      i. a solar array frame;
      ii. a solar array; which is connected to a front side of the solar array frame;
      iii. at least one solar array concentrator; which is connected to the front side of the solar array frame, to at least one side of the solar array;
      iv. a light sensor, which is mounted to the solar array frame;
      v. an elevation actuator; which is mounted to the solar array frame, such that it moves the solar array frame; in north and south directions;
      vi. a horizontal actuator, which is mounted to the solar array frame, such that it moves the solar array in east and west directions;
      vii. a mounting base, which is configured to be positionable on a ground surface;
      viii. a mounting column, which is connected to the mounting base, such that the mounting column protrudes upwards, and such that the solar array frame is connected to the mounting column, wherein the mounting column comprises a pivotal point, which is configured to permit a bending of the mounting column;
   b. a solar system cart, that is connected to the solar array stand via a power cable, wherein the solar system cart further comprises:
      i. a cart enclosure;
      ii. a radiant solar cooker chamber, such that the radiant solar cooker chamber is exposed to sunlight;
      iii. cart reflectors attached to the cart enclosure, such that the cart reflectors reflect the sunlight to direct the sunlight to the radiant solar cooker chamber;
   wherein the solar array stand is detachable from the solar system cart; and
   wherein the solar array stand is configured to be foldable into the solar system cart, via bending the mounting column in the pivotal point, whereby the photovoltaic intensification system is configurable for storage or transportation.

2. The photovoltaic intensification system of claim 1, wherein the solar array concentrator is a solar array reflector, which is connected to the front side of the solar array frame, to at least one side of the solar array.

3. The photovoltaic intensification system of claim 1, wherein the solar array concentrator is an optical lens.

4. The photovoltaic intensification system of claim 1, wherein the radiant solar cooker chamber is mounted inside the cart enclosure, such that the cart reflectors reflect the sunlight, via an enclosure aperture in the top of the cart enclosure, such that the sunlight is directed to the radiant solar cooker chamber.

5. The photovoltaic intensification system of claim 1, wherein the radiant solar cooker chamber is mounted on the outside of the cart enclosure, such that the radiant solar cooker chamber is exposed to the sunlight via translucent walls of the radiant solar cooker chamber.

6. The photovoltaic intensification system of claim 5, wherein the translucent walls are made of borosilicate glass, in the form of heat resistant compositions of glass including silica and boron trioxide.

7. The photovoltaic intensification system of claim 5, wherein the radiant solar cooker chamber further comprises a solar cooker fan, whereby the solar cooker fan dehydrate items in the radiant solar cooker chamber and reduces the temperature of the radiant solar cooker chamber.

8. The photovoltaic intensification system of claim 5, wherein the cart reflector is configured to fold up, such that the folded up cart reflector is positioned in a compartment of the cart enclosure for storage and transport.

9. The photovoltaic intensification system of claim 1, further comprising:
   a. a strong arm rod, which is connected to an upper mount body;
   b. a mass pivot rod which pivotally connects the strong arm rod with the mounting column; and
   c. an elevation actuating ring such that the elevation actuating ring pivotally connects the mass pivot rod with the elevation actuator, which is mounted to the mounting column;
   wherein the elevation actuator can pulse the elevator actuating ring to a predetermined position, which thereby pushes the elevation rod, thereby applying a leveraged force on the strong arm rod, thereby causing a rotation of the upper mount body, around the mass pivot rod, which causes a tilting of the solar array frame in either north or south vertical directions.

10. The photovoltaic intensification system of claim 1, further comprising:
   a. a horizontal actuating ring, which is connected to the solar array frame in an off-center position of the solar frame, such that an upper end of the horizontal actuator is connected with the solar array frame, via the horizontal actuating ring; and
   b. a horizontal tilt ring, which is connected to the solar frame in a center position of the solar frame, and further connects to an upper mount body;
   wherein the horizontal actuator can pulse the horizontal actuating ring to a predetermined position, which thereby via the horizontal tilt ring causes the tilting of the solar array frame in either east or west horizontal directions.

11. The photovoltaic intensification system of claim 1, further comprising a heat exchanger mounted on a rear side of the solar array, such that the heat exchanger receives cooling fluid that floods reservoir chambers of thermal channels in the heat exchanger, thereby transferring heat away from the solar array, whereby efficiency of the solar array is increased.

12. The photovoltaic intensification system of claim 1, further comprising cart wheels, mounted on each of two front corners of the solar system cart, to ease transportation of the solar system cart.

13. The photovoltaic intensification system of claim 1, further comprising a wireless speaker, wherein the wireless speaker communicates via a wireless protocol with a mobile device such that it receives and plays audio from the mobile device.

14. The photovoltaic intensification system of claim 1, wherein the mounting column is telescoping, such that a lower part of the mounting column slides in and out of an upper part of the mounting column, thereby adjusting the height of the mounting column, thereby adjusting the height of the solar frame.

* * * * *